(12) United States Patent
Dueber et al.

(10) Patent No.: US 8,270,145 B2
(45) Date of Patent: Sep. 18, 2012

(54) SCREEN-PRINTABLE ENCAPSULANTS BASED ON SOLUBLE POLYBENZOXAZOLES

(75) Inventors: Thomas Eugene Dueber, Wilmington, DE (US); Frank Leonard Schadt, III, Wilmington, DE (US); John D. Summers, Chapel Hill, NC (US)

(73) Assignee: CDA Processing Limited Liability Company, Wilmington, DE (US)

( * ) Notice: Subject to any disclaimer, the term of this patent is extended or adjusted under 35 U.S.C. 154(b) by 468 days.

(21) Appl. No.: 11/949,914

(22) Filed: Dec. 4, 2007

(65) Prior Publication Data

US 2009/0141425 A1 Jun. 4, 2009

(51) Int. Cl.
*H01G 4/06* (2006.01)
*C08K 5/07* (2006.01)
*C08G 18/42* (2006.01)

(52) U.S. Cl. ............... 361/321.1; 524/357; 524/361; 524/362

(58) Field of Classification Search .............. 524/361, 524/357, 362; 361/321.1
See application file for complete search history.

(56) References Cited

U.S. PATENT DOCUMENTS

| | | | |
|---|---|---|---|
| 4,820,793 A | 4/1989 | Imai et al. | |
| 4,931,532 A | 6/1990 | Reinhart | |
| 4,978,734 A * | 12/1990 | Khanna | 528/184 |
| 5,011,753 A | 4/1991 | Mueller et al. | |
| 5,883,221 A | 3/1999 | Sezi et al. | |
| 6,204,356 B1 | 3/2001 | Saito et al. | |
| 6,317,023 B1 | 11/2001 | Felten | |
| 6,423,815 B1 | 7/2002 | Nakajima et al. | |
| 6,518,390 B2 | 2/2003 | Okanuma et al. | |
| 6,860,000 B2 | 3/2005 | Felten | |
| 6,929,891 B2 | 8/2005 | Rushkin et al. | |
| 7,064,176 B2 | 6/2006 | Halik et al. | |
| 2003/0143480 A1 * | 7/2003 | Ueda et al. | 430/192 |
| 2004/0138406 A1 | 7/2004 | Halik et al. | |
| 2004/0152862 A1 | 8/2004 | Takasaki et al. | |
| 2005/0011857 A1 | 1/2005 | Borland et al. | |
| 2005/0154105 A1 | 7/2005 | Summers et al. | |
| 2007/0236859 A1 | 10/2007 | Borland et al. | |
| 2007/0244267 A1 | 10/2007 | Dueber et al. | |
| 2007/0290379 A1 | 12/2007 | Dueber et al. | |
| 2007/0291440 A1 | 12/2007 | Dueber et al. | |

FOREIGN PATENT DOCUMENTS

| | | |
|---|---|---|
| EP | 0990673 A | 4/2000 |
| EP | 1327653 A | 7/2003 |
| GB | 2188936 A | 10/1987 |
| GB | 2189788 A | 11/1987 |
| WO | 2004081664 A | 9/2004 |
| WO | WO 2007/034716 A1 | 3/2007 |

OTHER PUBLICATIONS

U.S. Appl. No. 60/874,667, filed Dec. 12, 2006, John D. Summers.
U.S. Appl. No. 60/950,483, filed Jul. 18, 2007, John D. Summers et al.

(Continued)

*Primary Examiner* — Ling Choi
*Assistant Examiner* — John Uselding

(57) ABSTRACT

This disclosure relates to compositions and methods for using such compositions to provide protective coatings, particularly of electronic components. Fired-on-foil ceramic capacitors coated with a polybenzoxazole encapsulant which may be embedded in printed wiring boards are disclosed.

22 Claims, 4 Drawing Sheets

OTHER PUBLICATIONS

P.J. Walsh et al., Environmental Effects of Poly-P-Phenylenebenobisoxazole Fibers. II. Attempts at Stabilization, Journal of Applied Polymer Science, 2006, vol. 102:3819-3829.

Houtz et al., Polymer Degradation Studies of Fluorinated Polymers: Thermal Behavior of 6F-PBO, Polymer Preprints, 1994, vol. 35:437-438.

European Search Report dated Sep. 11, 2009, European Application No. EP 08 16 9280.

Summers, John D. et al., Screen-Printable Encapsulants Based on Polyhydroxyamides That Thermally Convert to Polybenzoxazoles, U.S. Appl. No. 12/141,137, filed Jun. 18, 2008.

* cited by examiner

SCREEN-PRINTABLE ENCAPSULANTS BASED ON SOLUBLE POLYBENZOXAZOLES

FIELD OF THE DISCLOSURE

This invention relates to compositions, and the use of such compositions for protective coatings. In one embodiment, the compositions are used to protect electronic device structures, particularly embedded fired-on-foil ceramic capacitors, from exposure to printed wiring board processing chemicals and for environmental protection.

TECHNICAL BACKGROUND OF THE DISCLOSURE

Electronic circuits require passive electronic components such as resistors, capacitors, and inductors. A recent trend is for passive electronic components to be embedded or integrated into the organic printed circuit board (PCB). The practice of embedding capacitors in printed circuit boards allows for reduced circuit size and improved circuit performance. Embedded capacitors, however, must meet high reliability requirements along with other requirements, such as high yield and performance. Meeting reliability requirements involves passing accelerated life tests. One such accelerated life test is exposure of the circuit containing the embedded capacitor to 1000 hours at 85% relative humidity, 85° C. under 5 volts bias. Any significant degradation of the insulation resistance would constitute failure.

High capacitance ceramic capacitors embedded in printed circuit boards are particularly useful for decoupling applications. High capacitance ceramic capacitors may be formed by "fired-on-foil" technology. Fired-on-foil capacitors may be formed from thick-film processes as disclosed in U.S. Pat. No. 6,317,023B1 to Felten or thin-film processes as disclosed in U.S. Patent Application 20050011857 A1 to Borland et. al.

Thick-film fired-on-foil ceramic capacitors are formed by depositing a thick-film capacitor dielectric material layer onto a metallic foil substrate, followed by depositing a top copper electrode material over the thick-film capacitor dielectric layer and a subsequent firing under copper thick-film firing conditions, such as 900-950° C. for a peak period of 10 minutes in a nitrogen atmosphere.

During firing of the thick-film dielectric material, the glass component of the dielectric material softens and flows before the peak firing temperature is reached, coalesces, encapsulates the functional phase, and finally forms a monolithic ceramic/copper electrode film.

The foil containing the fired-on-foil capacitors is then laminated to a prepreg dielectric layer, capacitor component face down to form an inner layer and the metallic foil may be etched to form the foil electrodes of the capacitor and any associated circuitry. The inner layer containing the fired-on-foil capacitors may now be incorporated into a multilayer printed wiring board by conventional printing wiring board methods.

The fired ceramic capacitor layer may contain some porosity and, if subjected to bending forces due to poor handling, may sustain some microcracks. Such porosity and microcracks may allow moisture to penetrate the ceramic structure and when exposed to bias and temperature in accelerated life tests may result in low insulation resistance and failure.

In the printed circuit board manufacturing process, the foil containing the fired-on-foil capacitors may also be exposed to caustic stripping photoresist chemicals and a brown or black oxide treatment. This treatment is often used to improve the adhesion of copper foil to prepreg. It consists of multiple exposures of the copper foil to caustic and acid solutions at elevated temperatures. These chemicals may attack and partially dissolve the capacitor dielectric glass and dopants. Such damage often results in ionic surface deposits on the dielectric that results in low insulation resistance when the capacitor is exposed to humidity. Such degradation also compromises the accelerated life test of the capacitor.

It is also important that, once embedded, the encapsulated capacitor maintain its integrity during downstream processing steps such as the thermal excursions associated with solder reflow cycles or baking cycles. Delaminations and/or cracks occurring at any of the various interfaces of the construction or within the layers themselves could undermine the integrity of the embedded capacitor by providing an avenue for moisture penetration into the assembly.

An approach to solve these issues is needed. Various approaches to improve embedded passives have been tried. An example of an encapsulant composition used to reinforce embedded resistors may be found in U.S. Pat. No. 6,860,000, issued to Felten.

Polybenzoxazoles ("PBOs") may have utility as encapsulants since they generally possess low diffusion coefficients to moisture and gases, a high degree of dimensional stability, high toughness, high Tg, low to moderate coefficient of thermal expansion, low water uptake, and good adhesion. However, in the investigation of the use of polybenzoxazoles in fibers, a problem was identified. With poly-p-phenylenebenzobisoxazole fibers, P. J. Walsh et. al., in the Journal of Applied Polymer Science, Vol. 102, 3819-3829 (2006), indicated there were issues identified with hydrolytic reactions of weak bases and acids, such as morpholine, pyridine and trimethylphosphate that were used to extract residual phosphoric acid. There was evidence that there were hydrolytic reactions involving the oxazole nitrogen that led to disruption of the oxazole ring structure.

PBOs that are claimed to be soluble in the literature that are based on a solubilizing diamine component, 2,2-bis(3-amino-4-hydroxyphenyl)hexafluoropropane (6F-AP) were described by L. R. Denny et. al. at the $22^{nd}$ International SAMPE Technical Conference, Nov. 6-8, 1990 and by Houtz et. al., Polymer Preprints, 1994, 35 (1), 437-8. These references describe a search for thermoplastic canopy materials that are tolerant towards aerodynamic heating needed to aid in high speed Air Force applications. The PBOs identified were soluble in non-screen print solvents such as methanesulfonic acid, sulfuric acid, chloroform or THF.

In U.S. Pat. No. 7,064,176B to Halik et. al., soluble polyhydroxyamides that thermally convert to PBOs, were prepared to be used as adhesives to bond chips to electronic packages. Solvents that are infinitely soluble in water were used to spin coat the polymer solutions onto wafers. For screen print applications, most of the solvents indicated are too low boiling and have too much water absorption. The higher boiling solvents indicated, NMP and gamma-butyrolactone, attack the screen emulsion, the squeegee, and/or are infinitely soluble in water, which makes these solvents unusable for screen-printing.

In WO 2007/034716 A1 to M. Hasegawa et. al., a sulfone-containing PBO is described that has high solubility in solvents, but the solvents described are not acceptable paste screen print solvents. NMP is one of the solvents listed. A number of the solvents listed do not dissolve all the polybenzoxazoles of the present disclosure such as N,N-dimethylacetamide, gamma-butyrolactone, acetone and toluene.

SUMMARY OF THE DISCLOSURE

A screen-printable composition for coating an electronic component that may be embedded in a printed wiring board comprising a polybenzoxazole polymer and an organic solvent is disclosed. The polybenzoxazole polymer comprises repeating units represented by the formula

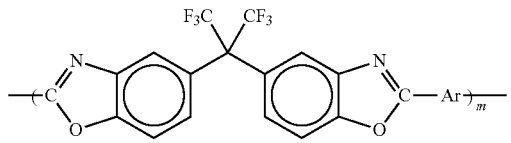

wherein m is the number of repeating units in the polybenzoxazole and Ar is independently selected from:

a.

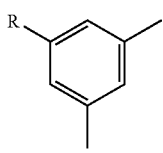

wherein R is H, $CH_3$, $C(CH_3)_3$ or $OCH_3$;

b.

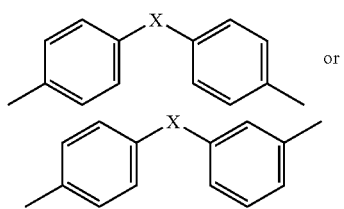

wherein X is O, $SO_2$, $C(CF_3)_2$, $C(CH_3)_2$, C=O, or O bonded by para-$C_6H_5O$;

c.

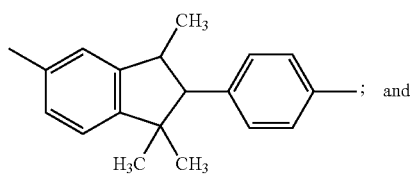

; and d.

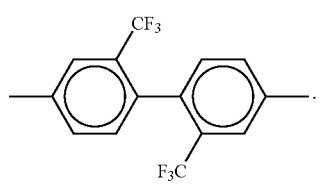

The organic solvent has a melting point no greater than about 5° C., and is selected from the group of alpha, beta-unsaturated cycloalkanones; isopropenyl or exocyclic double bond-substituted cycloalkanones; alpha-acetyl cycloalkanones; alpha-acetyl cycloalkenes; butenone substituted cycloalkenes; greater than five member ring lactams; bicyclic ketones; and mixtures thereof.

The invention is also directed to a method of encapsulating an electronic component that may be embedded in a printed wiring board or an IC package substrate. The method includes the steps of screen-printing the electronic component with a composition comprising a polybenzoxazole and an organic solvent, and removing the organic solvent by baking the printed electronic component at a temperature of less than about 300° C. to form a polybenzoxazole encapsulant on the electronic component. Preferred polybenzoxazoles and organic solvents are described in the paragraph above.

The inventive compositions can be applied as an encapsulant to fired-on-foil ceramic capacitors that may be embedded in printed wiring boards as well as other electronic components. The inventive compositions may include inorganic electrically insulating fillers, defoamers, and colorants.

DETAILED DESCRIPTION OF THE DISCLOSURE

Definitions

Figure 1A:
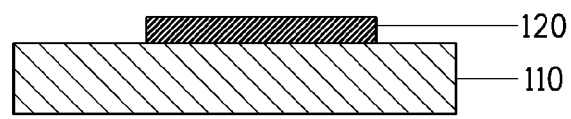
FIG. 1A through 1G show the preparation of capacitors on commercial 96% alumina substrates that were covered by the composite encapsulant compositions and used as a test vehicles to determine the composite encapsulant's resistance to selected chemicals.

The following definitions are used herein to further define and describe the disclosure.

As used herein and recited in the claims, the term "a" includes the concepts of "at least one" or "one or more than one".

A "component" used herein refers to an ingredient in a composition, whereas an "electronic component" refers to an electronic device such as a capacitor.

A "coating" is used herein to refer to a composition that has been applied over an electronic component and dried with heating to remove the solvent.

A "prepreg" is a glass epoxy or a bis-maleimide-triazole resin composition that adheres the encapsulated capacitor to a printed wiring board during a hot press lamination.

"Embedded" herein refers to laminating an electronic part into a printed wiring board.

A "defoamer" is a material that suppresses bubble formation during screen printing of an encapsulant paste.

"Consolidated" herein refers to a coating obtained after removal of solvent from a screen printed paste.

Test Methods

Procedures used in the testing of the compositions of the disclosure, the examples and for the comparative examples are provided as follows:

Insulation Resistance of the capacitors is measured using a Hewlett Packard high resistance meter, and is reported in Gohms.

Peel Strength is measured according to the procedure of IPC-TM-650, method 2.4.9, Revision A or B, and is reported in lbs/linear inch (or PLI).

Capacitance and loss (dissipation factor) were measured using a Hewlett-Packard 4262A LCR meter. The test signal was set at 10 kHz.

Temperature Humidity Bias (THB) Test. The THB Test of ceramic capacitors embedded in printed wiring boards involves placing the printed wiring board in an environmental chamber and exposing the capacitors to 85° C., 85% relative humidity and a 5 volt DC bias for 1000 hours. Insulation resistance of the capacitors is monitored periodically. Failure of the capacitor is defined as a capacitor showing less than 10 Meg-ohms in insulation resistance.

Brown Oxide Test. A capacitor is exposed to a Mac Dermid (Mac Dermid Incorporated of Waterbury Conn.) brown oxide treatment in the following series of steps: (1) 60 sec. soak in a solution of 4-8% $H_2SO_4$ at 40° C., (2) 120 sec. soak in DI water at room temperature, (3) 240 sec. soak in a solution of 3-4% NaOH with 5-10% amine at 60° C., (4) 120 sec. soak in DI water at room temperature, (5) 120 sec. soak in a solution of 20 ml/l $H_2O_2$ and $H_2SO_4$ acid with additive at 40° C., (6) a soak for 120 sec. at 40° C. in a solution made by mixing 280 ml of Mac Dermid Part A chemical solution diluted in 1 liter of DI water plus 40 ml of Mac Dermid Part B chemical solution diluted in 1 liter of DI water, and (7) a deionized water soak for 480 sec. at room temperature. Insulation resistance of the capacitor is then measured after the exposure steps. Failure is defined as a capacitor showing less than 10 Meg-Ohms in insulation resistance.

Encapsulant Film Moisture Absorption is measured according to ASTM D570 where polybenzoxazole solution is coated with a 20-mil doctor knife on a one oz. copper foil substrate. The wet coating is dried at 120° C. for about 10 minutes in a forced draft oven to yield a polybenzoxazole film of 2 mils thickness. In order to obtain a thickness of greater than 5 mils as specified by the test method, two more layers are coated on top of the dried polybenzoxazole film with a 10 min 120° C. drying in a forced draft oven between the second and third coating. The three-layer coating is dried 1 hr at 190° C. in a forced draft oven. The polybenzoxazole film thus formed is removed from the copper substrate by etching the copper using commercially available acid etch technology. Samples of one inch by 3-inch dimensions are cut from the free-standing film and dried at 120° C. for 1 hour. The strips are weighed and immersed in deionized water for 24 hrs. Samples are blotted dry and weighed to determine the weight gain so that the percent water absorption can be calculated. Larger film samples are also placed in an 85° C./85% RH chamber for 48 hours to measure the water uptake of the samples under these conditions.

GLOSSARY

The following abbreviations used in the disclosure, the examples and the comparative examples below:

| | |
|---|---|
| Beta-ionone | 4-(2,6,6-trimethyl-1-cyclohexenyl)-3-buten-2-one |
| Butyl carbitol acetate | diethylene glycol mono n-butyl ether acetate |
| Carbitol acetate | diethylene glycol monoethyl ether acetate |
| Carvone | (R)-5-isopropenyl-2-methyl-2-cyclohexenone |
| CTE | Coefficient of thermal expansion |
| DBE-3 | 10% dimethyl glutarate, 89% dimethyl adipate and 0.2% dimethyl succinate |
| Dihydrocarvone | (+)-5-isopropenyl-2-methyl-2-cyclohexanone |
| Dipentene | 4-isopropenyl-1-methylcyclohex-1-ene |
| DI water | Deionized water |
| DMAC | Dimethylacetamide |
| Dowanol PPh | Propylene glycol phenyl ether |
| DPMA | dipropylene glycol methyl ether acetate |
| 6F-AP | 2,2-bis(3-amino-4-hydroxyphenyl)-hexafluoropropane |
| Fenchone | (1R)-1,3,3-trimethylbicyclo[2.1.1]heptan-2-one |
| Isophorone | 3,5,5-trimethyl-2-cyclohexene-1-one |
| $M_w$ | Weight average molecular weight |
| $M_n$ | Number average molecular weight |

-continued

| | |
|---|---|
| NMP | N-methyl-2-pyrrolidinone |
| PBO | Polybenzoxazole |
| Pulegone | (R)-2-isopropylidene-5-methylcyclohexanone |
| Terpineol | 2-(4-methyl-3-cyclohexenyl)-2-propanol |
| Texanol | 2,2,4-trimethyl-1,3-pentanediol mono(2-methylpropanoate) |
| $T_g$ | Glass transition temperature |
| THF | Tetrahydrofuran |
| THB | Temperature, humidity, bias of 85° C., 85% RH and 5 volt DC |
| Verbenone | (1S,5S)-4,6,6-trimethylbicyclo[3.1.1]hept-3-en-2-one |

The compositions described herein provide an unexpected, novel, superior encapsulant composition that allows for direct screen-printing of a polybenzoxazole encapsulant material on an electronic component. A superior encapsulant and encapsulated electronic components having superior properties are also described.

The incorporating polybenzoxazoles into thick film formulations is largely unexplored. Of particular interest for encapsulant applications is utilizing diamine monomers that have solubilizing $CF_3$ functionality.

The present disclosure provides a thick film encapsulant composition comprising (1) one or more soluble polybenzoxazoles and (2) a select organic solvent.

A fired-on-foil ceramic capacitor coated with one or more polybenzoxazole encapsulants, thermally dried and embedded in a printed wiring board is disclosed. The application and processing of the encapsulant is designed to be compatible with printed wiring board and integrated circuit (IC) package processes. The PBO encapsulants also provide protection to the fired-on-foil capacitor from moisture, printed wiring board fabrication chemicals prior to and after embedding into a printed wiring board and integrated circuit (IC) package, and accommodates mechanical stresses generated by localized differences in relative thermal expansion coefficients of the capacitor element and organic components without delaminating. Application of the encapsulant compositions to the fired-on-foil ceramic capacitor allows the capacitor embedded inside the printed wiring board to pass 1000 hours of accelerated life testing conducted at 85° C., 85% relative humidity under 5 volts of DC bias.

Encapsulant compositions are disclosed comprising: a soluble polybenzoxazole or a mixture of polybenzoxazoles, a select organic solvent or mixture of such solvents, and optionally one or more of an inorganic electrically insulating filler, a defoamer and/or a colorant dye.

It has been found that the most stable encapsulants are obtained with the use of polybenzoxazoles that also have low moisture absorption of 2% or less, preferably 1.5% or less, more preferably 1% or less. Polybenzoxazoles used in the compositions with water absorption of 1% or less tend to provide consolidated materials with preferred protection characteristics. The amount of water absorption is determined by ASTM D-570, which is a method known to those skilled in the art.

Polybenzoxazoles

Generally, the polybenzoxazole component of the present disclosure can be represented by the formula:

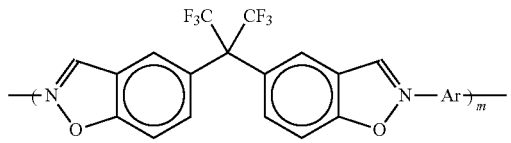

wherein m is the number of repeating units in the polybenzoxazole and Ar is independently selected from:

a.

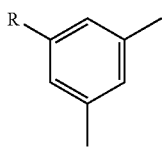

wherein R is H, $CH_3$, $C(CH_3)_3$ or $OCH_3$;

b.

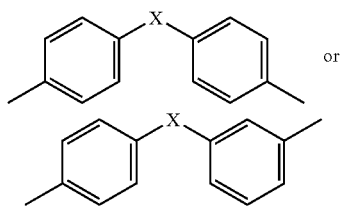

wherein X is O, $SO_2$, $C(CF_3)_2$, $C(CH_3)_2$, C=O, or O bonded by para-$C_6H_5O$;

c.

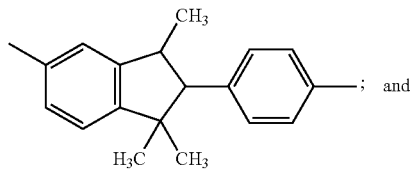
; and d.

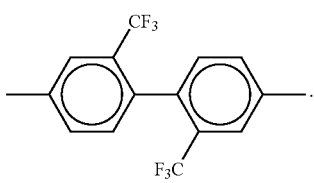

Typically, the number of repeating units m in the polybenzoxazoles is in the range of 10 to 500, and more typically is in the range of 20 to 400.

The polybenzoxazoles of the present disclosure are chosen such that they are soluble in select screen printing solvents. The solvents have a melting point no greater than about 5° C., and are selected from the group of alpha, beta-unsaturated cycloalkanones; isopropenyl or exocyclic double bond-substituted cycloalkanones; alpha-acetyl cycloalkanones; alpha-acetyl cycloalkenes; butenone substituted cycloalkenes; greater than five member ring lactams; bicyclic ketones; and mixtures thereof. These solvents are represented by the formulas:

(1) Cycloalkeneones

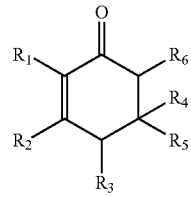

wherein R1, R2, R3, and R5 are each independently H or $CH_3$; R4 is H, $CH_3$ or $CH(CH_3)=CH_2$; or R3 and R6 together form a methylene group forming an internal four member ring.

(2) Cycloalkanones with Isopropenyl or Exocyclic Double Bond Substitution

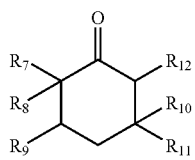

wherein R7 is H; R8 and R9 are each independently H or $CH_3$ (or R7 and R8 together form =$C(CH_3)_2$); R10 is H; R1 is H or $CH(CH_3)=CH_2$; R12 is H or $CH_3$.

(3) Acetyl Cycloalkenes

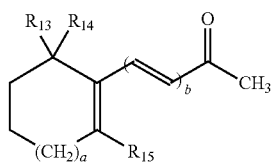

wherein a is 0 (a single C—C bond) or 1; b is 0 or 1; R13 and R14 are each independently H or $CH_3$; and R15 is H or $CH_3$.

(4) Acetyl Cycloalkanones

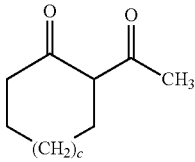

wherein c is 0 (a single C—C bond) or 1.

(5) Lactams

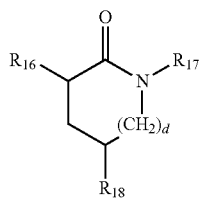

wherein d is 1 or 2; R16 and R18 are each independently H or CH$_3$; and R17 is CH$_3$.

(6) Bicycloketones, Particularly Fenchone

Polybenzoxazoles are not easily formulated into screen-printable thick film compositions due to their limited solubility characteristics in acceptable screen print solvents. While some polybenzoxazoles are known to be soluble in methanesulfonic acid, sulfuric acid, chloroform, THF and meta-cresol, their solubility in traditional screen printing solvent families such as extended alcohols, ethers and acetates has not been fully explored. Furthermore, the solvents that are known to dissolve these polybenzoxazoles are not acceptable screen printing solvents and therefore polybenzoxazoles have not been generally regarded as potential candidates for thick film paste formulations. Chloroform and THF are low boiling point solvents that are unacceptable for screen printing since the polybenzoxazole must remain in solution for an hour or more on the screen for screen printing operations, which requires boiling points above typically 190° C. Methanesulfonic acid is too high boiling and is a corrosive solvent that would be unacceptable for application to electronic components. Meta-cresol, another solvent indicated in the literature for polybenzoxazoles, has a boiling point in the correct range, but it is highly poisonous and is malodorous. Therefore, this would be an unacceptable screen print solvent, because screen printing is often done in mostly open environments in clean rooms.

The polybenzoxazoles of the present disclosure are prepared by reacting a suitable diacid (or mixture of suitable diacids) with one or more selected diamines. The mole ratio of diacid component to diamine component is preferably from between 0.9 to 1.1. Preferably, a slight molar excess of an end capping agent, such as benzoic acid or aniline, can be added to control chain length of the polybenzoxazole, and to assure that there are no amine or carboxylic acid terminated end groups in the polybenzoxazole.

Diacids useful in the practice of the present disclosure are, isophthalic acid, 5-tert-butylisophthalic acid, 4,4'-oxybis (benzoic acid), 3,4'-oxybis(benzoic acid), 2,2-bis(4-benzoic acid)hexafluoropropane, 1,1,3-trimethyl-5-carboxy-3(p-carboxyphenyl)indan, 4,4'-sulfonyldibenzoic acid, 2,2'-bis(trifluoromethyl)-4,4'-biscarboxybiphenyl, (4,4'-p-phenylenedioxy)dibenzoic acid, 4,4'-methane-bis(benzoic acid), and 2,2-bis(4-benzoic acid)propane. An o-hydroxyphenyl diamine of choice is 2,2-bis(3-amino-4-hydroxy)hexafluoropropane (6F-AP). A less soluble hydroxy diamine, 3,3'-dihydroxy-4,4'-diaminobiphenyl, can be used in combination with 6F-AP with the ratio determined by the solubility of the polybenzoxazole in the desired select screen printing solvent of the present disclosure.

Alternatively, the corresponding diacid chlorides can be used to prepare poly(o-hydroxyamides) by reaction with o-hydroxyphenyl diamines at sub-ambient temperatures in a suitable solvent and in the presence of an acid acceptor. The poly(o-hydroxyamide) intermediates can then be cyclodehydrated chemically or thermally to produce the corresponding soluble polybenzoxazole.

The thick film compositions contain a select organic solvent of the present disclosure. The screen-printable compositions are sufficiently viscous for use in screen printing and therefore may be referred to as screen-printable pastes. The choice of solvent or mixtures of solvents will depend in part on the polybenzoxazole used in the composition. The solvent or solvent mixture must dissolve the particular polybenzoxazole. The different polybenzoxazoles of the present disclosure have different solubilities in the select solvents of the present disclosure. The solvent should not have a high affinity for moisture absorption because the encapsulant paste may be in contact with ambient air for an hour or more. If too much water is absorbed into the encapsulant paste, the polybenzoxazole could loose solubility causing the screen or stencil to become blocked. The polybenzoxazoles of the present disclosure were found not to be soluble in common screen print solvents. Most common screen print solvents are acyclic, but no acyclic solvent was found to dissolve the polybenzoxazoles. A screen print solvent, terpineol, which has an alicylic or also called a cyclic structure, was found not to dissolve the polybenzoxazoles. The several classes of cyclic select solvents of the present disclosure that were found to be useful in accordance with the practice of the present disclosure are in the categories of alpha, beta-unsaturated cycloalkanones, isopropenyl-substituted cycloalkanones, alpha-acetyl cycloalkanones, alpha-acetyl cycloalkenes, butenone substituted cycloalkenes, greater than five member ring lactams and bicyclic ketones.

Literature references indicated that some polybenzoxazole structures of the generalized formula are soluble in organic liquids such as chloroform or tetrahydrofuran (THF). Acyclic and some cyclic solvents that have boiling points in the higher temperature range of 190° C. to 260° C. and having a Hanson hydrogen bonding solubility parameter between about 2.5 and 4, as a comparison with the solubility parameters of chloroform and THF, do not dissolve the polybenzoxazoles. Polybenzoxazole will dissolve in meta-cresol, which has a high hydrogen bonding solubility parameter of around 7.0, but will not dissolve in any common screen print solvents which generally have hydrogen bonding solubility parameters above 4.0. As a result of these results, solubility parameters were found to be ineffective in predicting usable screen print solvents for the polybenzoxazoles of the present disclosure.

Instead, the special, select classes of solvents of the present disclosure were found to be needed in order to dissolve the polybenzoxazoles to prepare screen-printable pastes. Slight modifications of the structure of the select solvents were found to have a large effect on the modified solvent being able to dissolve the polybenzoxazoles. An example is 3,5,5-trimethyl-2-cyclohexen-1-one (isophorone), which is an effective solvent for the polybenzoxazoles, but a close comparative structure, 3,5,5-trimethylcyclohexanone, which is the same structure without the double bond in the cyclohexanone ring, does not dissolve the polybenzoxazoles. Another surprising result is that a substituted tetrahydrofuran (THF), tetrahydrofurfuryl acetate does not dissolve the polybenzoxazoles. Several comparative examples in the present disclosure illustrate these unexpected results. Other solvents with cyclic structure that were found not to dissolve the polybenzoxazoles are gamma-butyrolactone, alpha-methyl-gamma-butyrolactone, terpineol, dipentene, propylene carbonate and furfural acetate. It was surprising that none of these solvents dissolve the polybenzoxazoles of the present disclosure, but it verifies the importance of the select solvent structures of the present disclosure.

The select solvent for screen printing application has a normal boiling point ranging from between and including any two of the following numbers 190, 200, 210, 220, 230, 240, 250 and 260. In one embodiment of the present disclosure, a useful solvent is carvone, which is (R)-5-isopropenyl-2-methyl-2-cyclohexenone. Cosolvents may be added provided that the polybenzoxazole is still soluble, performance in screen-printing is not adversely affected, and lifetime storage is also not adversely affected.

Examples of common screen printing solvents that the polybenzoxazoles of the present disclosure are not soluble in are: Texanol, Dowanol PPh (propylene glycol phenyl ether), Dowanol Eph (ethylene glycol phenyl ether), DBE solvents, butyl Cellosolve acetate, Carbitol, hexyl Carbitol, butyl Carbitol, Carbitol acetate, butyl Carbitol acetate, dibutyl Carbitol, dipropylene glycol butyl ether, dipropylene glycol methyl ether acetate, triethylene glycol methyl ether, triethylene glycol dimethyl ether, triethylene glycol diacetate, tripropylene glycol methyl ether. These are all acyclic structure solvents. A common screen print solvent, which is cyclic and which the polybenzoxazoles are not soluble in is terpineol.

As the polybenzoxazoles of the present disclosure are prepared from aromatic diacids and aromatic diamines, it was thought that phenyl-substituted, also called aromatic substituted, solvents would dissolve the polybenzoxazoles. However none were found. Examples of these phenyl substituted solvents are acetophenone, phenoxy-2-propanone, 4-phenyl-2-butanone and 1-phenoxy-2-propanol. It is surprising that the oxidized form of Dowanol® PPh, phenoxy-2-propanone, does not dissolve the polybenzoxazoles because Dowanol® PPh was found to be a good screen print solvent for the poly(o-hydroxyamide) precursors to the polybenzoxazoles of the present disclosure, and because some ketone solvents of the present disclosure were found to be useful solvents.

The solution of polybenzoxazole in the select solvents described herein must be stable to high humidity. Otherwise the polymer could precipitate or oil out of solution, which is a description of a low viscosity solvent layer forming on top of a viscous polymer layer. It is important that the polybenzoxazole remains in solution while on the screen during printing in high % RH conditions. A test to verify that the select solvents of the present disclosure do not allow the polybenzoxazoles to separate from the solvent in high humidity conditions was needed. A test procedure that gave a good assessment of stability involved placing a small amount of polybenzoxazole solution in a closed glass container that contained water at room temperature. Polybenzoxazole dissolved in NMP oiled out after only one hour with this test. Solutions of polybenzoxazole in most of the select solvents of the present disclosure were stable for at least 24 hours and usually for more than one week in the presence of high % RH. Although the solutions became slightly hazy, the polybenzoxazoles stayed in solution without the viscosity of the solutions changing appreciably and with no separation of a top solvent layer. There was a difference in the performance of the different select solvents of the present disclosure. Solutions of polybenzoxazole in lactam solvents, except for NMP were stable long enough for screen printing operations that can require stability for up to 1 hour. Solutions of polybenzoxazole in 1,3-dimethyl-2-piperidone and 1,5-dimethyl-2-piperidone were stable to high % RH up to 3 hours before a slight oiling out of polymer occurred. Solutions of polybenzoxazole in N-methylcaprolactam were stable to high % RH for 2 days before the polymer started oiling out.

Generally, thick-film compositions that contain filler are mixed and then blended on a three-roll mill. Pastes are typically roll-milled for three or more passes at increasing levels of pressure until a suitable dispersion has been reached. After roll milling, the pastes may be formulated to printing viscosity requirements by addition of solvent. A defoamer may be added as needed to reduce bubble formation during screen printing. A colorant may be added to give the paste a desired color.

Drying of the paste or liquid composition is accomplished by any number of standard drying methods including convection heating, forced air convection heating, vapor phase condensation heating, conduction heating, infrared heating, induction heating, or other techniques known to those skilled in the art. A significant benefit of the compositions described herein is that these compositions can be dried at temperatures below 300° C., and even at baking temperatures below 250° C., or even below 200° C. High temperatures above 350° C. are not required as is the case with poly(o-hydroxyamides) because the polymers are already fully converted to the polybenzoxazole structure.

Example 1

Polybenzoxazole 1 (PBO-1) Preparation

In a dry 3 neck round bottom flask with mechanical stirrer and nitrogen inlet was added 12.9119 grams of 4,4'-oxybis (benzoic acid), 18.3112 grams 6F-AP, 196 grams of 1,2-dichlorobenzene and 120.25 grams of trimethylsilyl polyphosphate (PPSE). The reaction mixture was stirred and heated gradually using an oil bath to 135° C. and held at the temperature for 24 hours. The viscous mixture was slowly heated to 165° C., held for 15 hours at this temperature and then cooled to room temperature. The product was precipitated out in methanol with an air-driven Waring blender, filtered, reblended two more times followed by filtration, with a total of 5 liters of methanol used for these workup steps. The solid was Soxhlet-extracted with ammonium hydroxide solution for 48 hours to remove any acidic impurities, rinsed out of the thimble with DI water and filtered. The solid was resuspended in DI water and filtered and washed with DI water until the filtrate was neutral. The filtered solid was vacuum oven dried at 140° C. for 16 hours to yield 23.4 grams of polybenzoxazole with $M_n$ of 40,300 and $M_w$ of 151,000.

Example 2

Polybenzoxazole 2 (PBO-2) Preparation

The procedure of Example 1 was followed with 15.0014 grams of 4,4'-(hexafluoroisoproylidene)bis(benzoic acid), 14.0450 grams of 6F-AP, 150 grams of 1,2-dichlorobenzene and 91.67 grams of trimethylsilyl polyphosphate. The reaction mixture was stirred and heated as in Example 1, and worked up in the same way with overnight Soxhlet extraction in ammonium hydroxide solution to yield, after rinsing and vacuum oven drying for 18 hours at 140° C., 20.47 grams of polybenzoxazole of Mn 29,600 and Mw of 85,800.

Example 3

Polybenzoxazole 3 (PBO-3) Preparation

The procedure of Example 1 was followed with 5.0134 grams of 1,1,3-trimethyl-5-carboxy-3-(p-carboxyphenyl)indan, 5.6606 grams of 6F-AP, 60 grams of 1,2-dichlorobenzene and 37.07 grams of trimethylsilyl polyphosphate. The reaction mixture was stirred and heated as in Example 1, and worked up in the same way as in Example 1. Instead of Soxhlet extraction, the solid product was stirred in 15% aqueous ammonium hydroxide solution at 80° C. for 2 hours, filtered and the solid washed with DI water until the filtrate was neutral. The filtered solid was vacuum oven dried for 18 hours at 140° C. to yield 7.8 grams of polybenzoxazole of Mn of 24,500 and Mw of 98,700.

Example 4

Polybenzoxazole 4 (PBO-4) Preparation

The procedure of Example 1 was followed with 5.000 grams of 5-tert-butylisophthalic acid, 8.241 grams of 6F-AP, 97 grams of 1,2-dichlorobenzene and 54.08 grams of trimethylsilyl polyphosphate. The reaction mixture was stirred and heated as in Example 1, and worked up in the same way as in Example 1. Instead of Soxhlet extraction, the solid product was stirred in 50/50 DI water/ammonium hydroxide solution at 80° C. for 2 hours, filtered and the solid washed with DI water until the filtrate was neutral. The filtered solid was vacuum oven dried for 18 hours at 145° C. to yield 8.0 grams of polybenzoxazole of a bimodal distribution with Mn of 16,200 and 198,800 and Mw of 206,300 and 418,000.

Example 5

Polybenzoxazole 5 (PBO-5) Preparation

The procedure of Example 1 was followed with 3.737 grams of isophthalic acid, 8.2402 grams of 6F-AP, 88 grams of 1,2-dichlorobenzene and 54.13 grams of trimethylsilyl polyphosphate. The reaction mixture was stirred and heated as in Example 1. A mostly solid mass was obtained, which was cut in pieces in the workup procedure prior to blending with methanol but was otherwise worked up in the same way as in Example 1. Instead of Soxhlet extraction, the solid product was stirred in ammonium hydroxide solution at reflux for 2 hours, filtered and the solid washed with DI water until the filtrate was neutral. The filtered solid was vacuum oven dried for 18 hours at 140 to 150° C. to yield 9.6 grams of polybenzoxazole of Mn of 10,900 and Mw of 65,700.

Example 6

Polybenzoxazole 6 (PBO-6) Preparation

The procedure of Example 1 was followed with 6.128 grams of 4,4'-sulfonyl dibenzoic acid, 7.324 grams of 6F-AP, 98 grams of 1,2-dichlorobenzene and 48.09 grams of trimethylsilyl polyphosphate. The reaction mixture was stirred and heated as in Example 1, and worked up in the same way as in Example 1. Instead of Soxhlet extraction, the solid product was stirred in 50/50 DI water/ammonium hydroxide solution at 80° C. for 2 hours, filtered and the solid washed with DI water until the filtrate was neutral. The filtered solid was vacuum oven dried for 18 hours at 145° C. to yield 9.8 grams of polybenzoxazole of Mn of 14,800 and Mw of 40,700.

Example 7

Polybenzoxazole 1 Paste Production

A solution of 20% solids of the polybenzoxazole of Example 1 in carvone was prepared with mechanical stirring at 80° C. for 5 hours. The solution was filtered with applied pressure through a 0.2 micron filter.

Example 8

Preparation of Encapsulated Ceramic Capacitors, Analysis of Chemical Stability of Encapsulant Twenty individual singulated capacitors on commercial 96% alumina substrates were covered by encapsulant compositions and tested to determine the encapsulant's resistance to selected chemicals. The capacitors were prepared in the following manner as schematically illustrated in FIG. 1A through 1G.

Figure 1B:
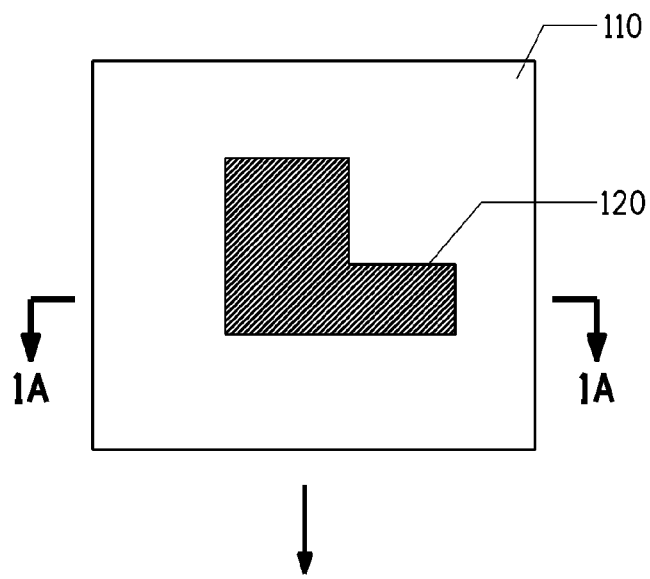

As shown in FIG. 1A, an electrode material paste of copper powder, glass frit, ethyl cellulose polymeric binder, solvent and surfactants (EP 320 obtainable from E. I. du Pont de Nemours and Company) was screen-printed onto the alumina substrate 110 to form electrode pattern 120. As shown in FIG. 1B, the area of the electrode was 0.3 inch by 0.3 inch and contained a protruding "finger" to allow connections to the electrode at a later stage. The electrode pattern was dried at 120° C. for 10 minutes and fired at 930° C. under copper thick-film nitrogen atmosphere firing conditions.

Figure 1C:
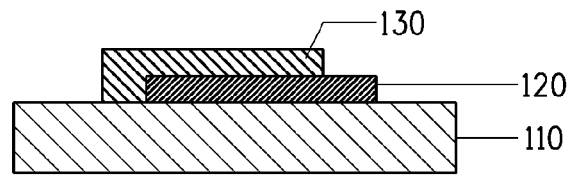
Figure 1D:
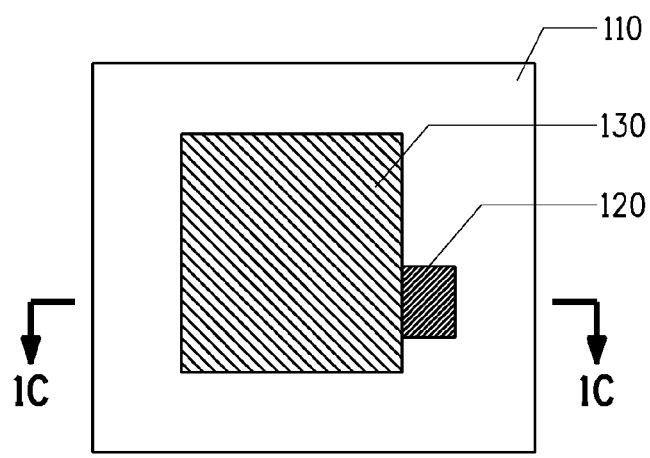

As shown in FIG. 1C, a dielectric material containing barium titanate powder, glass frit, ethyl cellulose polymeric binder, solvent, processing aids and surfactants (EP 312 obtainable from E.I. du Pont de Nemours and Company) was screen-printed onto the electrode to form dielectric layer 130. The area of the dielectric layer was approximately 0.33 inch by 0.33 inch and covered the entirety of the electrode except for the protruding finger. The first dielectric layer was dried at 120° C. for 10 minutes. A second dielectric layer was then applied, and also dried using the same conditions. A plan view of the dielectric pattern is shown in FIG. 1D.

Figure 1E:
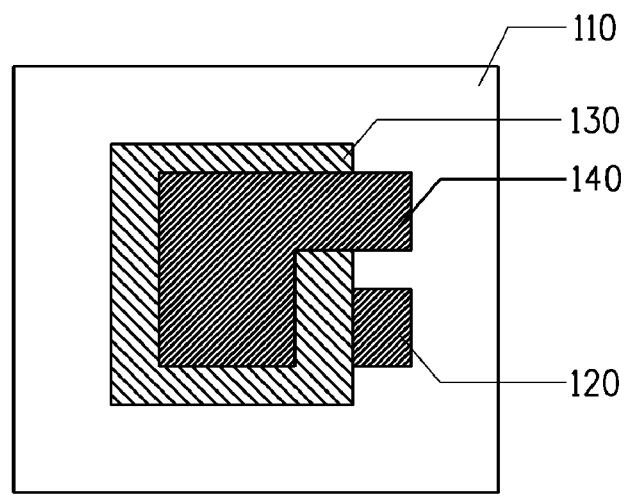

As shown in FIG. 1E, electrode material paste of copper powder, glass frit, ethyl cellulose polymeric binder, solvent and surfactants (EP 320 obtainable from E. I. du Pont de Nemours and Company) was screen-printed over the second dielectric layer to form electrode pattern 140. The electrode was 0.3 inch by 0.3 inch but included a protruding finger that extended over the alumina substrate. The copper paste was dried at 120° C. for 10 minutes.

The first dielectric layer, the second dielectric layer, and the copper paste electrode were then co-fired at 930° C. under copper thick-film firing conditions.

Figure 1F:
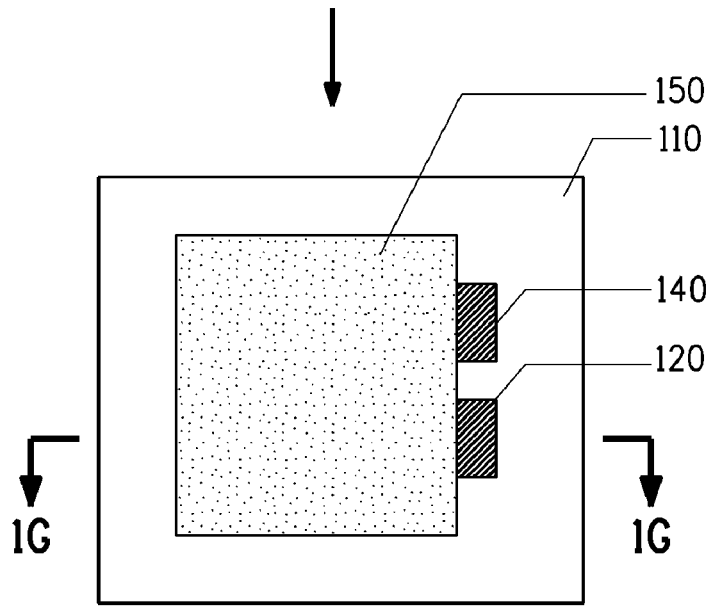
Figure 1G:
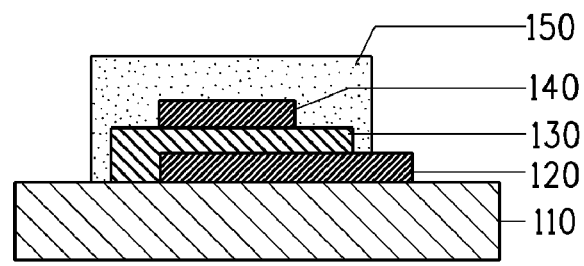

The encapsulant composition of Example 7 was screen printed through a 180 mesh screen over the entirety of the capacitor electrode and dielectric except for the two fingers using the pattern shown in FIG. 1F to form a 0.4 inch by 0.4 inch encapsulant layer. The encapsulant layer was dried for 10 minutes at 120° C. Another layer of encapsulant was printed with the formulation prepared in Example 7 through a 180-mesh screen directly over the first encapsulant layer and dried for 10 minutes at 120° C. A side view of the final stack is shown in FIG. 1G. The encapsulant 150 was then baked under nitrogen in a forced draft oven at 190° C. for 30 minutes. The final thickness of the encapsulant 150 was approximately 10 microns.

After encapsulation, the average capacitance of the twenty capacitors was 63.3 nF/cm$^2$, the average loss factor was 2.1%, the average insulation resistance was 3.9 Gohms. The capacitors were then subjected to the Brown Oxide Test described previously. After the Brown Oxide Test treatment, the average capacitance, loss factor, and insulation resistance of the twenty capacitors were 65.3 nF/cm², 2.0%, and 3.7 Gohm, respectively. Unencapsulated coupons did not survive the Brown Oxide Test exposure.

The twenty encapsulated capacitors that were subjected to the Brown Oxide Test were next tested according to the Temperature Humidity Bias Test described above. The twenty capacitors were subjected to a 5V DC bias and placed in an 85° C./85% RH oven for 1000 hours after which time the capacitance, loss and insulation resistance were measured again. The twenty capacitors survived the 1000 hours of THB testing. The average capacitance, loss factor, and insulation resistance of the twenty capacitors were 62.0 nF/cm², 2.2%, and 1.2 Gohm respectively. Two out of the twenty capacitors tested exhibited insulation resistance values below 10 Megohm.

Example 9

Figure 2A:
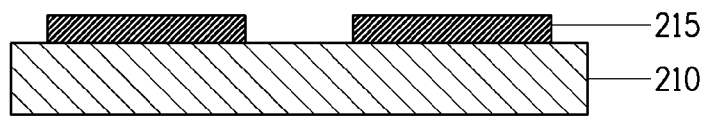
FIG. 2A-2E show the preparation of capacitors on copper foil substrates that were covered by encapsulant.
Figure 2B:
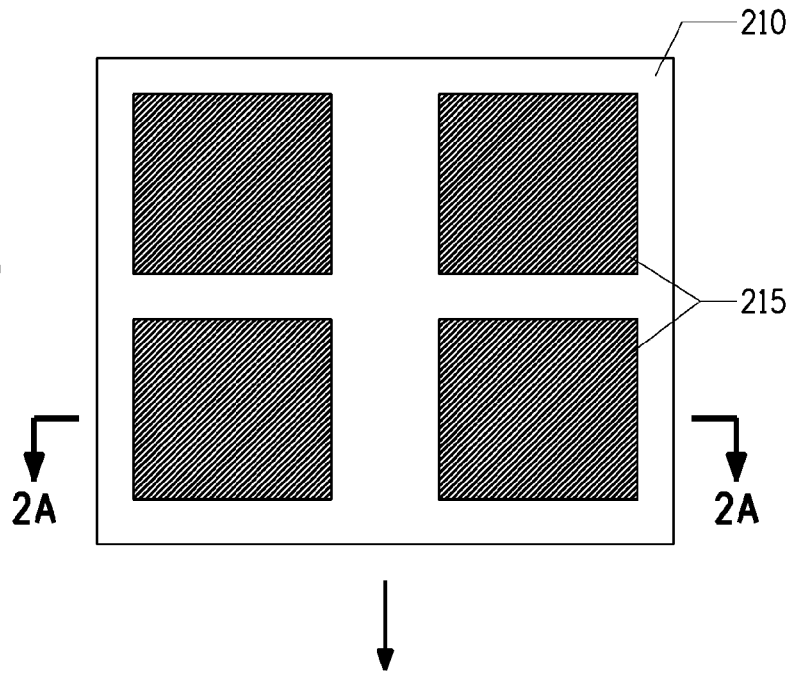

Preparation of Encapsulated Fired-on Foil Capacitors, Lamination with Prepreg and Core to Determine Adhesive Strength and Delamination Tendency Fired-on-foil capacitors were fabricated for use as a test structure according to the following process. As shown in FIG. 2A, a 1 ounce copper foil 210 was pretreated by screen-printing a paste of copper powder, glass frit, ethyl cellulose polymeric binder, solvent and surfactants (EP 320 obtainable from E. I. du Pont de Nemours and Company) as a preprint to the foil to form the pattern 215. The copper foil and powder were fired at 930° C. under copper thick-film firing conditions. Each preprint pattern was approximately 1.67 cm by 1.67 cm. A plan view of four of the preprints is shown in FIG. 2B. While FIG. 2A-2G shows a process in which four fired-on-foil capacitors are produced on the copper foil, in this example, two sets of 16 fired-on-foil capacitors were produced and tested.

Figure 2C:
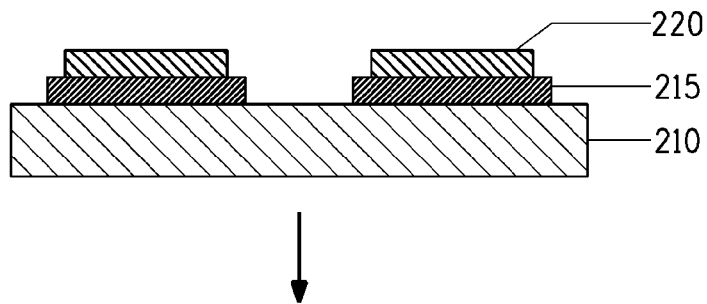

As shown in FIG. 2C, a dielectric material containing barium titanate powder, glass frit, ethyl cellulose polymeric binder, solvent, processing aids and surfactants (EP 312 obtainable from E.I. du Pont de Nemours and Company) was screen-printed onto the preprint of the pretreated foil to form a patterned first dielectric layer. The area of the dielectric layer was 1.22 cm by 1.22 cm and within the pattern of the preprint. The first dielectric layer was dried at 120° C. for 10 minutes. A second dielectric layer was then applied on the first dielectric layer, and also dried using the same conditions. The first and second patterned dielectric layers form the dielectric 220.

Figure 2D:
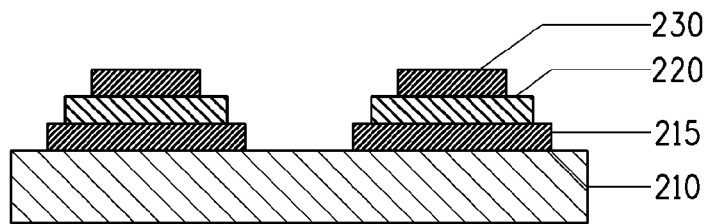

As shown in FIG. 2D, a paste of copper powder, glass frit, ethyl cellulose polymeric binder, solvent and surfactants (EP 320 obtainable from E. I. du Pont de Nemours and Company) was screen-printed over the dielectric 220 and within the area of the dielectric to form electrode pattern 230 and dried at 120° C. for 10 minutes. The area of the electrode was 0.9 cm by 0.9 cm.

The first dielectric layer, the second dielectric layer, and the copper paste electrode were then co-fired at 930° C. under copper thick-film firing conditions.

Figure 2E:
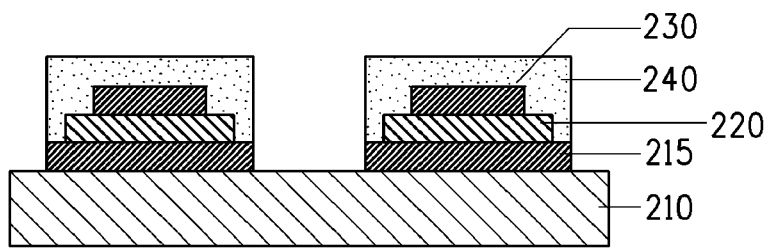
Figure 2F:
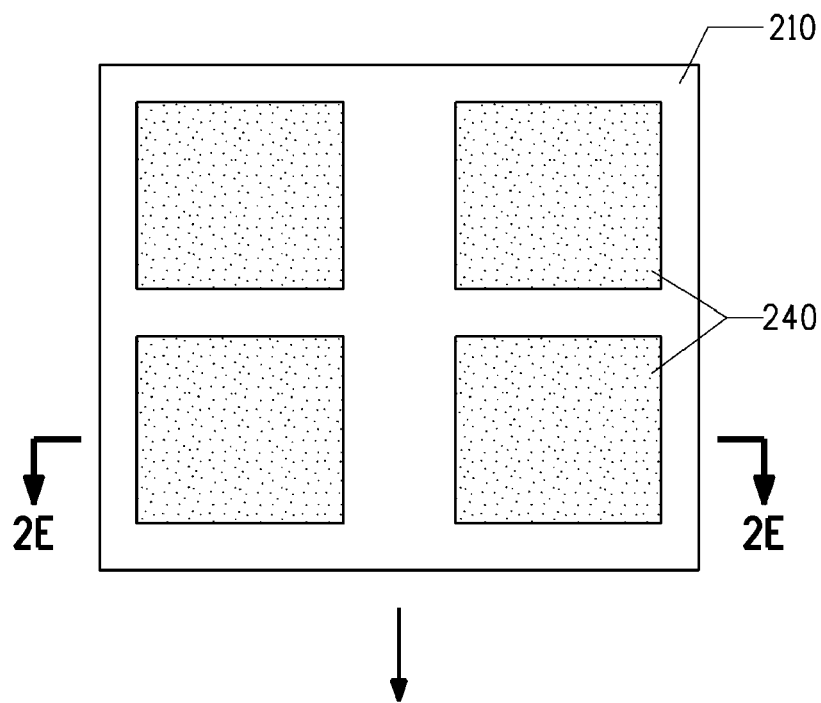
FIG. 2F shows a plan view of the structure of FIG. 2E.

The encapsulant composition as described in Example 7 was printed through a 180-mesh screen over the capacitors to form an encapsulant layer. The encapsulant layer was dried at 120° C. for ten minutes. A second encapsulant layer was then printed directly over the first layer using the paste prepared in Example 7 with a 180-mesh screen. The two-layer structure was then dried for 10 min at 120° C. and then baked at 190° C. under nitrogen for 30 minutes to yield a consolidated two-layer composite encapsulant 240 having the pattern as shown in FIG. 2E. The final thickness of the baked encapsulant 240 was approximately 10 microns. A plan view of the structure is shown in FIG. 2F.

Figure 2G:
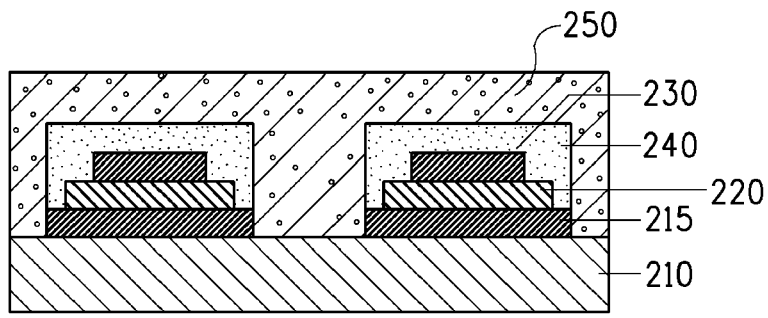
FIG. 2G shows the structure of FIG. 2F after lamination to resin.

The component side of the foil 210 was laminated to 1080 BT resin prepreg 250 at 190° C. and 400 psi for 90 minutes to form the structure shown in FIG. 2G. In this example, one set of 16 fired-on-foil capacitors was produced on one piece of copper foil to be used for peel strength testing, and a second set of 16 fired-on-foil capacitors was produced on another piece of copper foil to be used for delamination testing.

The adhesion of the prepreg to the encapsulant was tested using the IPC-TM-650 adhesion test number 2.4.9. The adhesion results are shown below. The average peel strength of the encapsulant from the 16 capacitors was greater than 3.3 lbs/linear inch. The failure mode was within the capacitor structure, not the encapsulant interface.

The second set of 16 fired-on-foil capacitors was laminated with 1080 BT resin prepreg and BT core in place of copper foil. These capacitors were subjected to 5 successive solder floats at 260° C., each exposure lasting two minutes, to determine the tendency for the structure to delaminate during thermal cycling. Ultrasonic inspection was used to determine if delamination occurred. No delamination was observed after the five cycles.

Examples 10-22

Select Solvents for PBOs

Dry polybenzoxazole particles of Examples 1-6 were placed in various solvents (10 wt % PBO/90 wt % solvent) and were heated at 80° C. to 100° C. and were observed until the PBO dissolved in the solvent or four hours had elapsed. The solutions were cooled to room temperature and observed for two days. If the PBO remained in solution after two days, the solvent is listed below as being a solvent for the PBO.

| Example | Solvent | PBO-1 | PBO-2 | PBO-3 | PBO-4 | PBO-5 | PBO-6 |
|---|---|---|---|---|---|---|---|
| 10 | Isophorone | Yes | Yes | Yes | Yes | No | No |
| 11 | Carvone | Yes | Yes | Yes | Yes | Yes | No |
| 12 | Dihydrocarvone | Yes | Yes | Yes | No | No | No |
| 13 | 1-acetyl-1-cyclohexene | Yes | Yes | Yes | yes | — | — |
| 14 | 2-acetyl-cyclopentanone | Yes | Yes | Yes | No | — | — |
| 15 | 3,5-trimethylcyclohexanone | Yes | Yes | — | — | — | — |
| 16 | Verbenone | Yes | Yes | Yes | Yes | No | No |
| 17 | Fenchone | Yes | Yes | Yes | No | No | No |
| 18 | Pulegone | Yes | — | — | — | — | — |
| 19 | Beta-ionone | Yes | — | — | — | — | — |
| 20 | N-methylcaprolactam | Yes | Yes | Yes | Yes | No | Yes |

| Example | Solvent | PBO-1 | PBO-2 | PBO-3 | PBO-4 | PBO-5 | PBO-6 |
|---|---|---|---|---|---|---|---|
| 21 | 1,3-dimethyl-2-piperidone | Yes | Yes | — | — | — | — |
| 22 | 1,5-dimethyl-2-piperidone | Yes | Yes | — | — | — | — |

Comparative Example 1

To the composition of Example 1 was added 5.000 grams of diphenic acid, 7.544 grams of 6F-AP, 92 grams of 1,2-dichlorobenzene and 49.55 grams of trimethylsilyl polyphosphate. The reaction mixture was stirred and heated as in Example 1, and worked up in the same way as in Example 1. Instead of Soxhlet extraction, the solid product was stirred in 50/50 DI water/ammonium hydroxide solution at 80° C. for 2 hours, filtered and the solid washed with DI water until the filtrate was neutral. The filtered solid was vacuum oven dried for 18 hours at 140° C. to yield 6.8 grams of polybenzoxazole.

Comparative ExampleS 2-7

Solubility of Comparative Example 1

Dry polybenzoxazole particles of Comparative Example 1 were placed in various solvents (10 wt % PBO/90 wt % solvent) and the samples were heated at 80° C. to 100° C. for four hours. The PBO did not dissolve in the solvents listed below.

| Comparative Example | Solvent | Result |
|---|---|---|
| 2 | Dowanol ® PPh | Not soluble |
| 3 | N-methylcaprolactam | Not soluble |
| 4 | Isophorone | Not soluble |
| 5 | Carvone | Not soluble |
| 6 | Dihydrocarvone | Not soluble |
| 7 | Verbenone | Not soluble |

This polybenzoxazole did not dissolve in the solvents above or in any other solvents investigated. This comparative example indicates that not all polybenzoxazoles prepared from diacids and 6F-AP are soluble.

Comparative ExampleS 8-24

Determination of Solubility of PBO-1-6 in Different Solvents

Dry polybenzoxazole particles of Examples 1-6 were placed in common screen-printing solvents or in other solvents that one skilled in the art might expect to dissolve the polybenzoxazole of the composition of the invention. The compositions (10 wt % PBO/90 wt % solvent) were heated at 80° C. to 100° C. for four hours to see if the PBOs dissolved in the solvents. The PBOs did not dissolve in the solvents listed below.

| Comparative Example | Solvent | PBO-1 | PBO-2 | PBO-3 | PBO-4 | PBO-5 | PBO-6 |
|---|---|---|---|---|---|---|---|
| 8 | Dowanol ® PPh | No | No | No | No | No | No |
| 9 | DBE-3 | No | No | | | | |
| 10 | DPMA | No | No | | | | |
| 11 | Propylene glycol diacetate | No | No | — | — | — | — |
| 12 | Tetrahydrofurfural acetate | No | No | No | No | No | |
| 13 | Texanol | No | No | — | — | — | — |
| 14 | Butyl Carbitol acetate | No | No | No | | No | |
| 15 | Carbitol acetate | No | No | — | — | — | — |
| 16 | Diethylene glycol butyl ether acetate | No | No | — | — | — | — |
| 17 | γ-butyrolactone | No | No | — | — | — | — |
| 18 | α-methyl-γ-butyrolactone | No | No | — | — | — | — |
| 19 | 3,5,5-trimethyl-cyclohexanone | No | No | — | — | — | — |
| 20 | Phenoxy-2-propanone | No | No | — | — | — | — |
| 21 | Terpineol | No | — | — | — | — | — |
| 22 | Dipentene | No | — | — | — | — | — |
| 23 | Propylene carbonate | No | — | — | — | — | — |
| 24 | Acetophenone | No | — | — | — | — | — |

Comparative Example 25

XPI-2

High performance soluble polyimides of low moisture absorption have been shown to have good encapsulant properties, especially adhesion during IR solder reflow and good THB resistant results. These polyimides can withstand selected oxide treatment processing especially if the contact time in high pH solution is controlled. However, if the exposure time is longer than desired, the high pH oxide treatment process will attack the polyimide. As a result of this, it is evident that even very high performance polymers may not provide all of the protection that is required for conventional processing of encapsulated ceramic capacitors. The following comparative example illustrates the performance of a polyimide based encapsulant.

A polyimide was prepared by conversion of a polyamic acid to polyimide with chemical imidization. To a dry three neck round bottom flask equipped with nitrogen inlet, mechanical stirrer and condenser was added 800.23 grams of DMAC, 70.31 grams of 3,3'-bis-(trifluoromethyl)benzidine (TFMB), 14.18 grams 2,2'-bis(3-amino-4-hydroxyphenyl) hexafluoropropane (6F-AP) and 0.767 grams of phthalic anhydride.

To this stirred solution was added over one hour 113.59 grams of 2,2'-bis-3,4-dicarboxyphenyl)hexafluoropropane dianhydride (6-FDA). The solution of polyamic acid reached a temperature of 32° C. and was stirred without heating for 16 hrs. To 104.42 grams of acetic anhydride were added followed by 95.26 grams of 3-picoline and the solution was heated to 80° C. for 1 hour.

The solution was cooled to room temperature, and the solution added to an excess of methanol in a blender to precipitate the product polyimide. The solid was collected by filtration and was washed 2 times by re-blending the solid in methanol. The product was dried in a vacuum oven with a nitrogen purge at 150° C. for 16 hrs to yield 165.6 grams of product having a number average molecular weight of 54,600 and a weight average molecular weight of 151,400.

A screen printable paste was prepared by dissolving 20 g of the isolated polyimide powder in 80 g DBE-3. After the polymer dissolved, 1.8 g RSS-1407 epoxy resin (diglycidyl ether of tetramethyl biphenyl) and 0.2 g benzotriazole were added to the polymer solution. After these ingredients were dissolved, the crude paste was filtered under pressure through 0.2 micron cartridge filter to yield the final product.

Comparative Example 26

Preparation of Encapsulated Ceramic Capacitors, Analysis of Chemical Stability of Polyimide Encapsulant A set of 20 capacitors prepared as described in Example 8 were used to evaluate the performance of encapsulant paste prepared in comparative Example 25. For Comparative Example 26, the encapsulant composition of Comparative Example 25 was screen printed through a 180 mesh screen over the entirety of each capacitor electrode and dielectric except for the two fingers using the pattern shown in FIG. 1F to form a 0.4 inch by 0.4 inch encapsulant layer. The encapsulant layer was dried for 10 minutes at 120° C. Another layer of encapsulant was printed with the formulation prepared in Example 7 through a 180-mesh screen directly over the first encapsulant layer and dried for 10 minutes at 120° C. The encapsulant was then baked under nitrogen in a forced draft oven at 190° C. for 30 minutes. The final thickness of the encapsulant was approximately 10 microns.

After encapsulation, the average capacitance of the twenty capacitors was 66.1 $nF/cm^2$, the average loss factor was 2.2%, and the average insulation resistance was 2.9 Gohms. The coupon of twenty capacitors was then subjected to the Brown Oxide Test described previously. The average capacitance, loss factor, and insulation resistance were 68.1 $nF/cm^2$, 2.3%, 3.1 Gohm respectively after the treatment.

The twenty capacitors that had been subjected to the Brown Oxide Test were subsequently subjected to a 5V DC bias and placed in an 85° C./85% RH oven for 1000 hours, according to the THB Test, after which time the capacitance, loss and insulation resistance were measured again. Only seven out of 20 capacitors survived 1000 hours of testing. The average values capacitance, loss factor, and insulation resistance for the surviving capacitors were 62.7 $nF/cm^2$, 2.4%, and 0.8 Gohm, respectively. Thirteen capacitors out of 20 tested exhibited insulation resistance values below 10 Meg-ohm after 1000 hours exposure under 5V bias according to the THB Test.

The improved performance of the polybenzoxazole encapsulants of Example 7 in the Brown Oxide Test indicates the performance advantage of PBO over high performance polyimide encapsulants. This was a surprising result. Both polyimides and PBOs are considered to have good stability to different chemicals, but the PBO encapsulants have an unexpected advantage when high pH processing is required.

What is claimed is:

1. A screen-printable composition paste for coating an electronic component that may be embedded in a printed wiring board comprising:
    a polybenzoxazole polymer; and
    an organic solvent;
    wherein:
    the screen-printable composition paste is sufficiently viscous for use in screen printing;
    the polybenzoxazole polymer includes repeating units represented by the formula

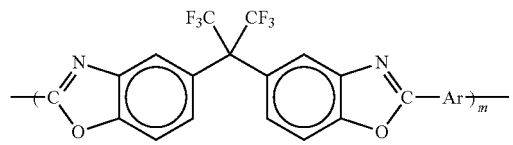

m is the number of repeating units in the polybenzoxazole and Ar is independently selected from the group consisting essentially of:

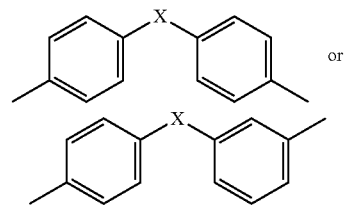

X is O, $SO_2$, $C(CF_3)_2$, $C(CH_3)_2$, C=O, or O bonded by para-$C_6H_5O$; and
the organic solvent has a melting point no greater than about 5° C.

2. The composition of to claim 1, wherein the organic solvent comprises alpha, beta-unsaturated cycloalkanones represented by the formula:

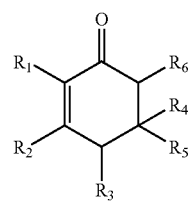

wherein R1, R2, R3, and R5 are each independently H or $CH_3$; R4 is H, $CH_3$ or $CH(CH_3)$=$CH_2$; or R3 and R6 together form a methylene group forming an internal four member ring.

3. The composition of claim 1, wherein the organic solvent comprises isopropenyl or exocyclic double bond-substituted cycloalkanones represented by the formula:

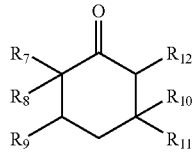

or exocyclic double bond-substituted cycloalkanones represented by the formula
wherein R7 is H; R8 and R9 are each independently H or $CH_3$ (or R7 and R8 together form $=C(CH_3)_2$; R10 is H; R11 is H or $CH(CH_3)=CH_2$; and R12 is H or $CH_3$.

4. The composition of claim 1, wherein the organic solvent comprises acetyl cycloalkenes represented by the formula

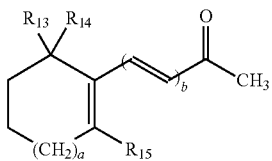

wherein a is 0 (a single C—C bond) or 1; b is 0 or 1; R13 and R14 are each independently H or $CH_3$; and R15 is H or $CH_3$.

5. The composition of claim 1, wherein the organic solvent comprises alpha-acetyl cycloalkanones represented by the formula:

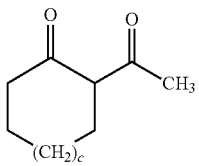

wherein c is 0 (a single C—C bond) or 1.

6. The composition of claim 1, wherein the organic solvent comprises lactams represented by the formula:

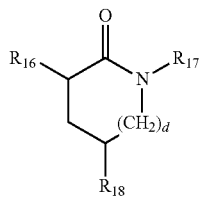

wherein d is 1 or 2; R16 and R18 are each independently H or $CH_3$; and R17 is $CH_3$.

7. The composition according to claim 1, wherein the organic solvent comprises bicyclic ketone consisting of fenchone.

8. A method of encapsulating an electronic component that may be embedded in a printed wiring board or an IC package substrate, the method comprising:
screen-printing the electronic component with a screen-printable composition according to claim 1; and
removing the organic solvent by baking the printed electronic component at a temperature of less than about 300° C.

9. The method of claim 1, wherein the organic solvent has a melting point no greater than about 5° C., and wherein the organic solvent is selected from the group consisting essentially of alpha, beta-unsaturated cycloalkanones; isopropenyl or exocyclic double bond-substituted cycloalkanones; alpha-acetyl cycloalkanones; alpha-acetyl cycloalkenes; butenone substituted cycloalkenes; greater than five member ring lactams; bicyclic ketones; and mixtures thereof.

10. The method of claim 8, wherein the electronic component is a fired-on-foil ceramic capacitor that may be embedded in a printed wiring board or an IC package substrate.

11. The method of claim 8, wherein the polybenzoxazole has a water absorption of 2% or less (based on the weight of the polybenzoxazole) according to the Encapsulant Film Moisture Absorption Test and a Tg greater than about 260° C.

12. The method of claim 8, wherein the polybenzoxazole encapsulant has a water absorption of about 1% or less (based on the weight of the polybenzoxazole) according to the Encapsulant Film Moisture Absorption Test.

13. The method of claim 8, wherein the screen-printable composition further comprises one or more of the following: an electrically insulated filler, a defoamer, or a colorant.

14. The method of claim 10, further comprising: the additional step of embedding the encapsulated capacitor in a printed wiring board using a prepreg, wherein the adhesion of the polybenzoxazole encapsulant to the capacitor and the adhesion of the polybenzoxazole encapsulant to the prepreg are both greater than 2 pounds force/inch, when measured according to IPCTM-650 adhesion test number 2.4.9.

15. The method of claim 10, wherein during said removing the organic solvent by baking the printed fired-on-foil ceramic capacitor, the baking temperature is at all times less than 250° C.

16. The method of claim 15, wherein during said removing the organic solvent by baking the printed fired-on-foil ceramic capacitor, the baking temperature is at all times less than 200° C.

17. An electronic component made according to the process of claim 9, wherein the electronic component is a fired-on-foil ceramic capacitor embedded in a printed wiring board using a prepreg.

18. The embedded capacitor of claim 17, wherein the embedded fired-on-foil capacitor does not delaminate from the prepreg when subjected to five successive solder floats at 260° C.

19. The embedded capacitor of claim 17 wherein in a Temperature Humidity Bias Test conducted at 85° C. with 85% relative humidity and a 5 volt DC bias, the insulation resistance of the capacitor remains greater than 10 megohms after 1000 hours.

20. An electronic component made according to the process of claim 9, wherein the electronic component is a fired-on-foil ceramic capacitor, and wherein a 30% solution of sulfuric acid does not penetrate the polybenzoxazole encapsulant when the capacitor is immersed in the sulfuric acid solution for 6 minutes.

21. The screen-printable composition paste of claim 1, wherein the organic solvent comprises isophorone, carvone, 1,3-dimethyl-2-piperidone, 1,5-dimethyl-2-piperidone, N-methylcaprolactam, dihydrocarvone, 1-acetyl-1-cyclohexene, 2-acetyl-cyclopentanone, 3,5-trimethylcyclohexanone, verbenone, fenchone, pulegone, beta-ionone, or N-methylcaprolactam.

22. The screen-printable composition paste of claim 1, wherein the organic solvent comprises isophorone or carvone.

* * * * *